United States Patent
Kamiyama et al.

(10) Patent No.: US 7,800,227 B2
(45) Date of Patent: Sep. 21, 2010

(54) SEMICONDUCTOR DEVICE WITH CRACK-RESISTANT MULTILAYER COPPER WIRING

(75) Inventors: Masamichi Kamiyama, Kawasaki (JP);
Masashi Takase, Kawasaki (JP);
Takanori Watanabe, Bunkyo (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/240,645

(22) Filed: Oct. 3, 2005

(65) Prior Publication Data
US 2006/0097396 A1    May 11, 2006

(30) Foreign Application Priority Data
Oct. 4, 2004    (JP)    ............................... 2004-291895

(51) Int. Cl.
*H01L 23/522*    (2006.01)
(52) U.S. Cl. ............................... 257/758; 257/E23.145
(58) Field of Classification Search ............ 257/758, 257/E23.145
See application file for complete search history.

(56) References Cited
U.S. PATENT DOCUMENTS 6,198,170 B1 *   3/2001   Zhao ........................... 257/784
6,455,943 B1 *   9/2002   Sheu et al. ................... 257/786
7,190,077 B2 *   3/2007   Bauer et al. .................. 257/762
2003/0080428 A1 * 5/2003  Izumitani et al. ............ 257/758
2003/0218259 A1 * 11/2003 Chesire et al. ............... 257/786

FOREIGN PATENT DOCUMENTS

| DE | 10229493 A1 * | 1/2004 |
| JP | 10-229085 | 8/1998 |
| JP | 11-150114 | 6/1999 |
| JP | 2003-86589 | 3/2003 |

* cited by examiner

Primary Examiner—Anh Phung
Assistant Examiner—Michael Lulis
(74) Attorney, Agent, or Firm—Westerman, Hattori, Daniels & Adrian, LLP

(57) ABSTRACT

In a semiconductor device including a multilayer pad, the multilayer pad comprises a first pad layer provided over a semiconductor substrate to have a first copper wiring region and a first intralayer insulating region provided within the first copper wiring region, and a second pad layer provided over the first pad layer via an interlayer insulating film to have a second copper wiring region and a second intralayer insulating region provided within the second copper wiring region. In the semiconductor device, the first copper wiring region, the first intralayer insulating region, the second copper wiring region, and the second intralayer insulating region are provided in the first and second pad layers such that the multilayer pad has a layout in which all the regions are covered with the copper wiring when the multilayer pad is perspectively viewed from a perpendicularly upper direction for the semiconductor substrate.

11 Claims, 10 Drawing Sheets

SEMICONDUCTOR DEVICE WITH CRACK-RESISTANT MULTILAYER COPPER WIRING

CROSS-REFERENCE TO RELATED APPLICATION

This application is based upon and claims the benefit of priority of Japanese Patent Application No. 2004-291895, filed on Oct. 4, 2004, the entire contents of which are herein incorporated by reference.

BACKGROUND OF THE INVENTION

1. Field of the Invention

The present invention generally relates to a pad structure of a semiconductor device, and more particularly to a multilayer pad structure of the semiconductor device in which a plurality of pad layers including the copper wirings formed with the damascene process are provided and reliability for mechanical stress has been improved.

2. Description of the Related Art

In recent years, a semiconductor device is more and more reduced in size of the design rule of wiring with accompaniment of further improvement in miniaturization and high packing density. A multilayer wiring structure consisting of copper (Cu) wiring has been employed corresponding to such tendency. The multilayer wiring formed of copper wiring is realized with the damascene process. Namely, a copper multilayer wiring is formed through the known process in which via holes are formed in an insulating film in order to connect grooves for wiring and wirings, the grooves and via holes are filled with copper, and copper adhered to the regions other than the grooves and via holes is removed with the chemical-mechanical polishing (CMP) process.

With the use of a multilayer wiring structure using copper wiring, a multilayer pad structure including the pad layer including the copper wiring formed with the damascene process which is similar to the copper multilayer wiring is also employed in the pad used for connection with various electrical signal lines from external system (data signal line, control signal line, and power source potential supply line or the like). For example, refer to Japanese Laid-Open Patent Application No. 2003-086589, Japanese Laid-Open Patent Application No. 11-150114, and Japanese Laid-Open Patent Application No. 10-229085.

FIG. 1 illustrates a multilayer pad structure including a pad layer which has copper wiring in a conventional device. In FIG. 1, (a) is a cross-sectional view of a copper pad layer (single layer), and (b) is a plan view of the copper pad layer. Only the pad region is illustrated and an internal circuit region is not illustrated.

In FIG. 1: reference numeral 11 denotes a semiconductor substrate; 12 denotes a pad layer; 13 denotes a wiring region constituting the pad layer; 14 denotes an intralayer insulating region provided in the wiring region 13; 15 denotes an interlayer insulating film; 16 denotes a via provided in the interlayer insulating film; and 17 denotes a cover film.

As illustrated in FIG. 1, the conventional multilayer pad structure is formed by laminating a plurality of pad layers 12 on the semiconductor substrate 11 via the interlayer insulating film 15 formed of a silicon oxide film. The cover film 17 is formed on the interlayer insulating film 15. This cover layer 17 is not formed on the pad layer 12, but an aperture is formed. A lead wire is connected to the uppermost pad layer 12a of the pad layer exposed at the aperture with the wire bonding method in the assembling process and a probe stylus is also in contact thereto in the test process for inspecting electrical characteristics of semiconductor device.

The uppermost layer 12a among the plurality of pad layers is formed of an aluminum (Al) wire. The remaining pad layers 12b and 12c are formed of a wiring region 13 of copper (Cu) and a plurality of intralayer insulating regions 14 of silicon oxide film allocated within the copper wiring region 13. Each pad layer is connected with a plurality of vias 16 provided in the interlayer insulating film 15. The plurality of vias 16 connects the aluminum wire of pad layer 12a and the copper wiring region 13 of the pad layer 12b and also connects the copper wiring regions 13 of the pad layers 12b, 12c to set up electrical connection among a plurality of pad layers. The plurality of vias 16 are formed of tungsten (W).

In FIG. 1, (b) illustrates the wiring layout of the pad layers 12b, 12c. The pad layers 12b, 12c have the identical wiring layout. As illustrated in FIG. 1, the pad layers 12b, 12c have the rectangular external wirings and a mesh type wiring structure ensuring constant lines and spaces is provided within the external wiring. That is, the copper wiring region 13 of the pad layers 12b, 12c forms the mesh type copper wiring network. Within the external wiring of the pad layers 12b, 12c, a plurality of rectangular intralayer insulating regions 14 are regularly allocated in the layout of constant pitch in the vertical and horizontal directions corresponding to the mesh type wiring structure.

In the pad layers 12b and 12c, a plurality of intralayer insulating regions 14 are provided in the internal portions thereof and the mesh type wiring structure is created, so that the restrictions for a maximum width of the copper wiring and a maximum occupation ratio of the copper wiring per unit area are satisfied. Thereby, influence of the dishing phenomenon in the CMP process can be lowered.

In the conventional pad structure of FIG. 1, since the copper pad layers 12b, 12c except for the uppermost layer 12a have the identical wiring layout, the region not covered with the copper wiring is generated within the region in the lower layers of the uppermost layer 12a when the pad region is perspectively viewed from the perpendicular upper direction for the semiconductor substrate 11. In other words, when the semiconductor substrate is perspectively viewed from the perpendicular upper direction, the region which is covered only with an insulating film is generated in the pad region except for the aluminum wiring of the uppermost layer 12a.

Since an insulating film, such as a silicon oxide film ($SiO_2$ film), is more soft than a metal material used for the wiring layer such as copper (Cu), the following problems (1) and (2) may arise when mechanical stress is applied to the pad from external side during the processes such as probing (touch of stylus) in the test process and wire bonding in the assembling process.

(1) In the portion of the pad region, a structure in which only a plurality of insulating films, such as the intralayer insulating region 14 and the interlayer insulating film 15 within the pad layer 12, are laminated as indicated by the dotted lines in FIG. 2. Therefore, if crack is generated in the insulating films of the upper layers of the multilayer pad due to externally applied mechanical stress, it is easily extended up to the insulating films of the lower layers or to the insulating films of the lower layer region of the multilayer pad as illustrated in FIG. 2.

If crack is continuously generated for a plurality of layers as described above, a problem in which water invades into the lower layer regions of the multiplayer pad via the crack. Thereby, reliability of the semiconductor device may be remarkably lowered.

(2) In the portion of the pad region, since only the insulating film is provided, except for the aluminum wiring in the uppermost layer, as the material for alleviating the externally applied mechanical stress, this stress is transferred in direct to the lower layer regions of the multilayer pad without attenuation. Accordingly, the lower layer regions of the multilayer pad may be damaged due to the externally applied mechanical stress, and thereby reliability of the semiconductor device is also remarkably lowered.

Particularly when the semiconductor elements, such as a transistor and connection wiring which form an input/output (I/O) circuit, are formed in the lower layer region of the multilayer pad, these semiconductor elements and wires are broken by the mechanical stress and thereby defective operation is generated in the input/output circuit.

In order to overcome the above problems (1) and (2), the counter-measure for increasing a coverage rate of the copper wiring when viewed perspectively from the perpendicular upper direction by expanding the area of the copper wiring region 13 within the pad layer 12 exceeding the restrictions for the maximum width of the copper wiring and the maximum occupation rate of the copper wiring per unit area cannot be taken because such counter-measure will increase the influence of the dishing phenomenon in the CMP process.

SUMMARY OF THE INVENTION

An object of the present invention is to provide an improved semiconductor device in which the above-mentioned problems are eliminated.

Another object of the present invention is to provide a multilayer pad structure which can improve reliability of the semiconductor device for externally applied mechanical stress without increasing the influence of the dishing phenomenon in the CMP process in the semiconductor device in which a plurality of pad layers are provided with inclusion of the pad layer having the copper wiring.

In order to achieve the above-mentioned objects, the present invention provides a semiconductor device including a multilayer pad, the multilayer pad comprising: a first pad layer provided over a semiconductor substrate to have a first copper wiring region and a first intralayer insulating region provided within the first copper wiring region, and a second pad layer provided over the first pad layer via an interlayer insulating film to have a second copper wiring region and a second intralayer insulating region provided within the second copper wiring region, wherein the first copper wiring region, the first intralayer insulating region, the second copper wiring region, and the second intralayer insulating region are provided in the first and second pad layers such that the multilayer pad has a layout in which all the regions are covered with the copper wiring when the multilayer pad is perspectively viewed from a perpendicularly upper direction for the semiconductor substrate.

According to the present invention, all the regions on the multilayer pad are covered with the copper wiring when the multilayer pad is viewed from the perpendicular upper direction for the semiconductor substrate. Because of this structure, reliability of the semiconductor device can be ensured even when a mechanical stress is applied from the external side to the multilayer pad in the probing during the test process or in the wire bonding during the assembling process.

BRIEF DESCRIPTION OF THE DRAWINGS

Other objects, features and advantages of the present invention will be apparent from the following detailed description when read in conjunction with the accompanying drawings.

DETAILED DESCRIPTION OF PREFERRED EMBODIMENTS

A description will now be given of the embodiments of the invention with reference to the accompanying drawings.

Figure 3:
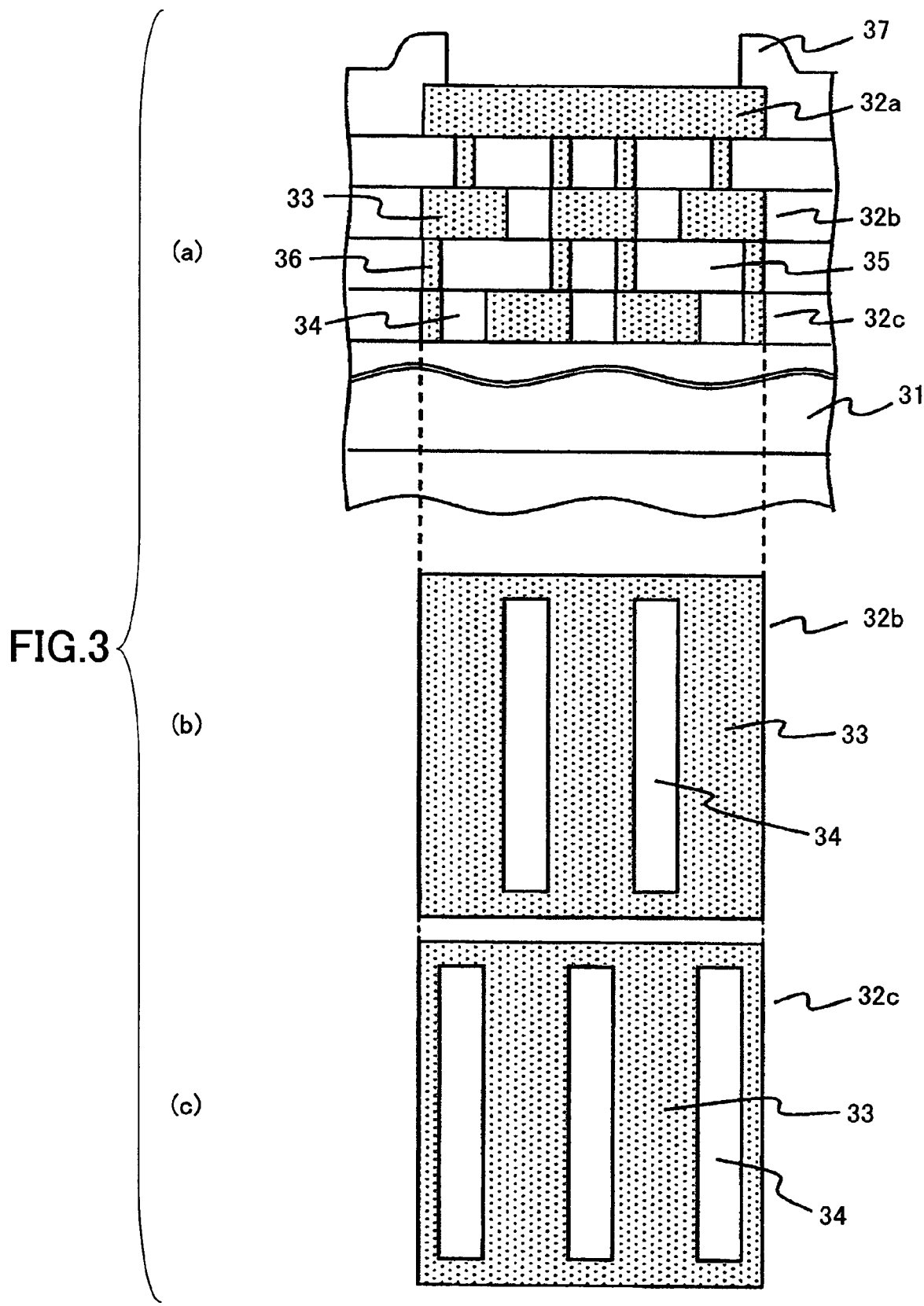
FIG. 3 is a schematic diagram of a multilayer pad structure including the pad layer having the copper wiring in a first embodiment of the invention.

FIG. 3 illustrates a multilayer pad structure including a pad layer having a copper wiring in the first embodiment of the invention. In FIG. 3, (a) is a cross-sectional view, and (b) and (c) are plan views of a copper pad layer (single layer). Only the pad region is illustrated and an internal circuit region is not illustrated.

In FIG. 3, reference numeral 31 denotes a semiconductor substrate, 32 denotes a pad layer, 33 denotes a wiring region forming the pad layer, 34 denotes an intralayer insulating region provided within the wiring region 33, 35 denotes an interlayer insulating film, 36 denotes a via provided in the interlayer insulating film, and 37 denotes a cover film. For the sake of convenience of description, a barrier metal layer and an etching stopper layer which are provided between the wiring region and the via and between the intralayer insulating region and the interlayer insulating film are not illustrated in FIG. 3. Also, in the drawings of the subsequent embodiments of the invention, they will be omitted.

As illustrated in FIG. 3, the multilayer pad structure of the first embodiment is formed by laminating a plurality of pad layers 32 on the semiconductor substrate 31 via the interlayer insulating film 35 formed of silicon oxide film. The cover film 37 is formed on the interlayer insulating film 35. The cover film 37 is not formed on the pad layer 32 but an aperture is formed. To the uppermost layer 32a of the pad layer exposed by the aperture, a lead wire is connected with the wire bonding in the assembling process and a probe stylus is placed in contact in the test process for inspecting electrical characteristics of a semiconductor device.

The uppermost layer 32a among the plurality of pad layers is formed of an aluminum (Al) wire. The remaining pad layers 32b and 32c are formed of the wiring region 33 of copper (Cu) and a plurality of intralayer insulating regions 34 of silicon oxide film allocated within the copper wiring region 33. Each pad layer is connected to a plurality of vias 36 provided within the interlayer insulating film 35. The plurality of vias 36 are also formed of copper. The plurality of vias 36 connect the aluminum wire of the pad layer 32a and the copper wiring region 33 of the pad layer 32b, also connect the copper wiring regions 33 of the pad layers 32b, 32c, and set up electrical connections among the plurality of pad layers. The vias 36 connecting the uppermost pad layer 32a and the second pad layer 32b are formed of tungsten (W) and the vias connecting the second pad layer 22b and the third pad layer 32c are formed of copper.

In FIG. 3, (b) illustrates a wiring layout of the pad layer 32b, and (c) illustrates a wiring layout of the pad layer 32c. As illustrated in FIG. 3, the pad layers 32b, 32c have the rectangular external wirings. A lattice type wiring structure including constant lines and spaces is provided within the external wiring. Namely, the copper wiring region 33 of the pad layers 32b, 32c forms a lattice type copper wiring group. Within the external wirings of the pad layers 32b, 32c, a plurality of rectangular intralayer insulating regions 34 are regularly allocated in the layout of the constant pitch in the horizontal direction of the figure corresponding to the lattice type wiring structure.

Since a plurality of intralayer insulating regions 34 are provided in the pad layers 32b and 32c to form the lattice type wiring structure, the pad layers 32b and 32c satisfy the restriction for the maximum width of the copper wiring and the maximum occupation rate of the copper wiring per unit area. Accordingly, the influence of the dishing phenomenon in the CMP process can be reduced.

Figure 1:
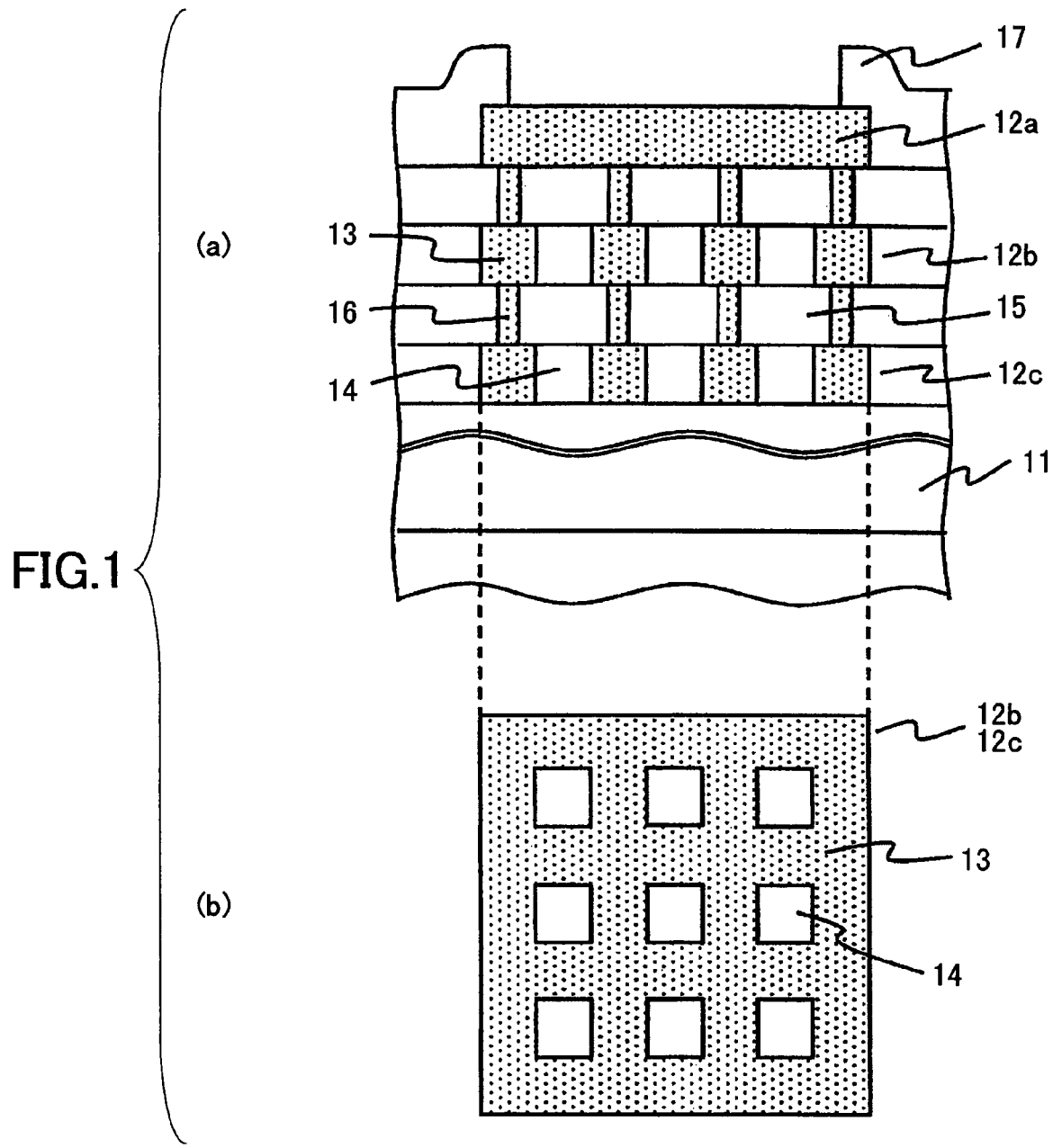
FIG. 1 is a schematic diagram of a multilayer pad structure including a pad layer having a copper wiring of a conventional semiconductor device.
Figure 2:
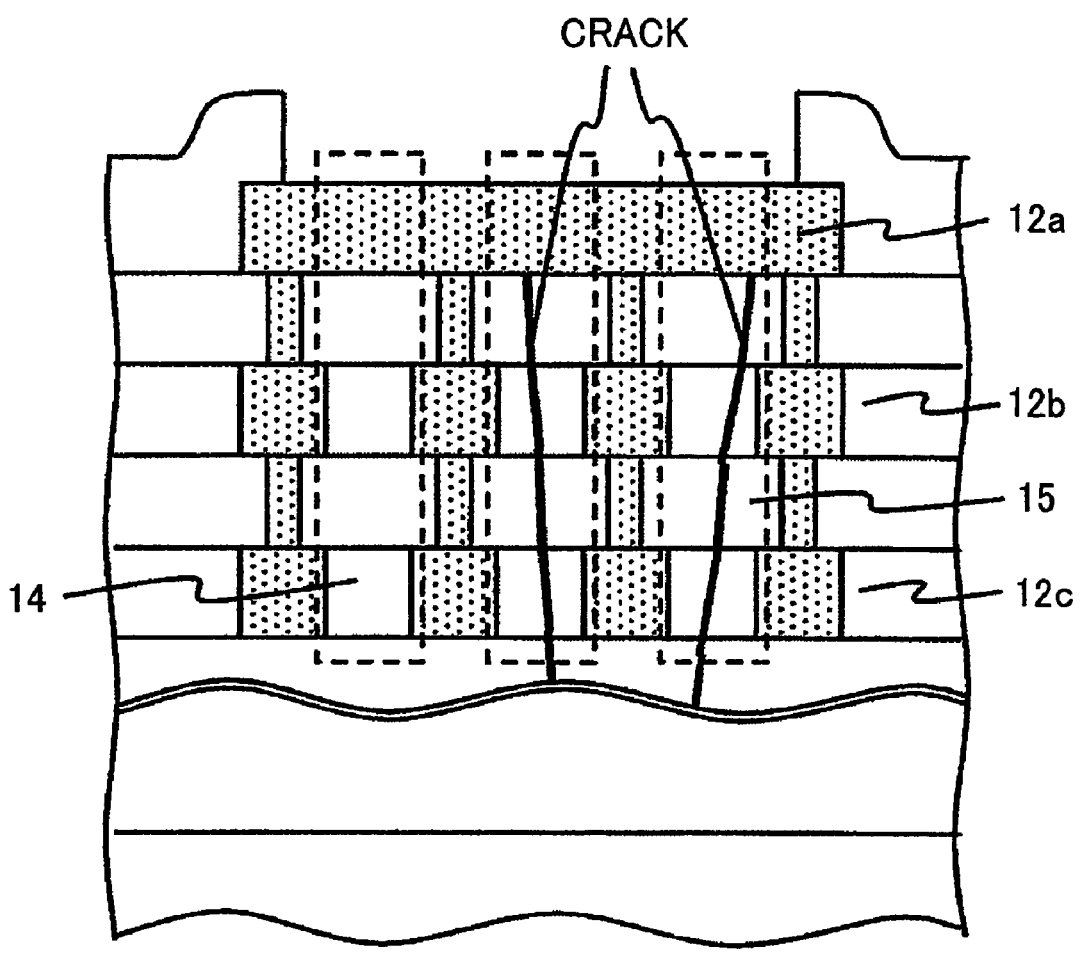
FIG. 2 is a diagram illustrating a structure in which only an insulating film is laminated in a plurality of layers in the conventional multilayer pad structure.

Unlike the conventional structure of FIG. 1, the pad layers 32b and 32c have different wiring layouts with each other. Specifically, the pad layers 32b and 32c have the complementary wiring layouts with each other. Namely, the copper wiring region 33 is formed in the region of the pad layer 32c located just under the intralayer insulating regions 34 at least within the pad layer 32. In the same manner, the copper wiring region 33 is formed in the region of the pad layer 32b located just above the intralayer insulating regions 34 at least within the pad layer 32c.

Because of the wiring layouts, all the regions are covered with the copper wiring in the region of the lower layer than the uppermost layer 32a, when the multilayer pad is perspectively viewed from the perpendicular upper direction for the semiconductor substrate 31. In other words, when viewed from the perpendicular upper direction, the entire part of the pad region is surely covered with the copper wiring in addition to the aluminum wiring of the uppermost layer 32a.

Figure 4:
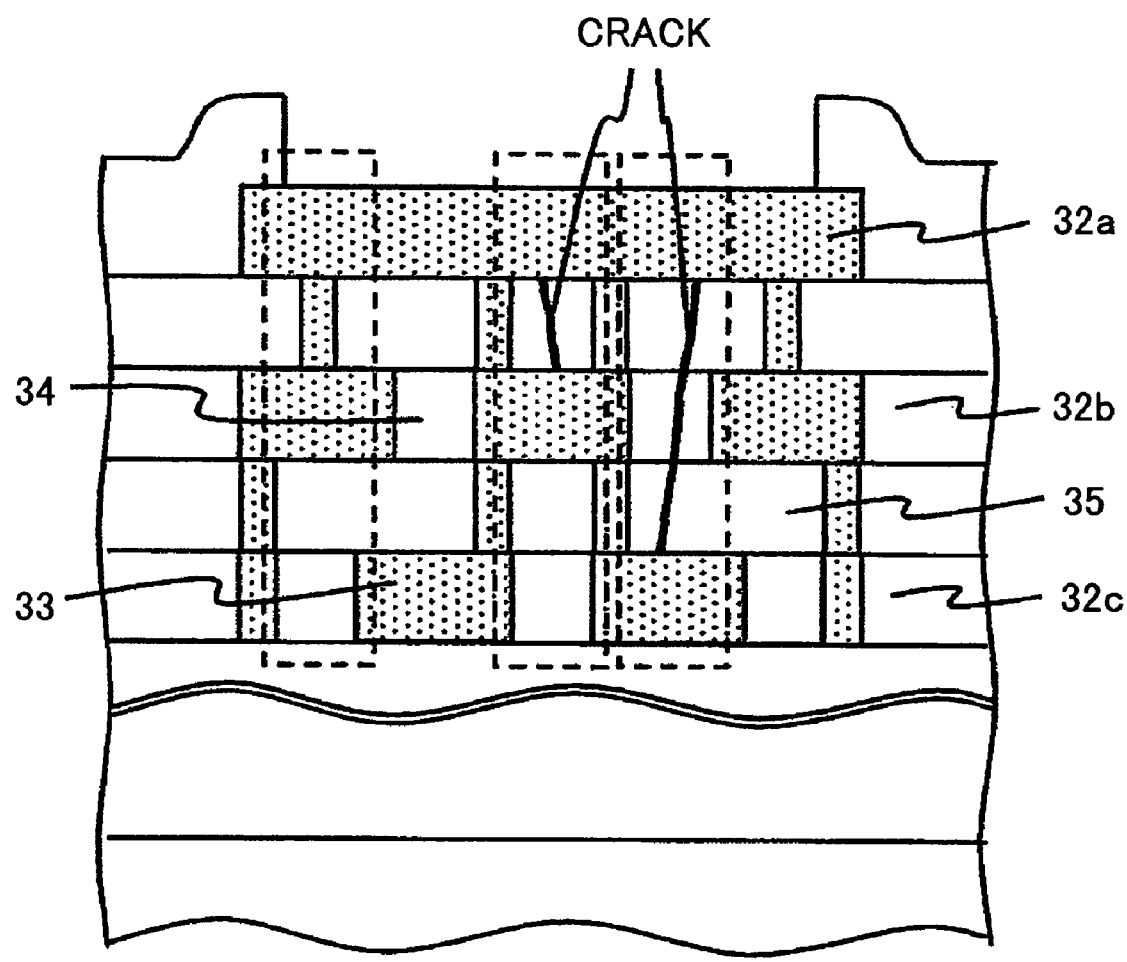
FIG. 4 is a diagram illustrating the condition where at least one copper wiring region exists in the path up to the lower layer region of the multilayer pad from the pad layer of the uppermost layer in the first embodiment of the invention.

According to the use of this structure, reliability of the semiconductor device can be assured as described below even when an external mechanical stress is applied to the multilayer pad in the probing (touch of a stylus) in the test process or in the wire bonding in the assembling process:

(1) As indicated by the dotted lines in FIG. 4, at least one copper wiring region 33 exists in the path up to the lower layer region of the multilayer pad from the pad layer 32a of the uppermost layer in all the pad regions. Accordingly, even if a crack is generated in the insulating film of the upper layer part of the multilayer pad because of an external mechanical stress, extension of crack can be stopped at the copper wiring region 33 of a certain pad layer. Therefore, extension of crack up to the insulating film of the lower layer region of the multilayer pad can be prevented.

Accordingly, generation of a problem that water invades into the lower layer region of the multilayer pad through the crack can be prevented, thereby moisture proof characteristic of the semiconductor device can be improved, and as a result, reliability of the semiconductor device can also be improved.

(2) At least one copper wiring region 33 exists, except for the aluminum wiring of the uppermost layer, in all the pad regions as the material for alleviating an external mechanical stress, and the externally applied mechanical stress can be attenuated with the effect of the copper wiring region 33. Therefore, the externally applied mechanical stress is transferred to the lower layer region of the multilayer pad under the condition that the stress is attenuated more than that in the conventional semiconductor device, and generation of damage in the lower layer region of the multilayer pad can be prevented.

Particularly, even if the semiconductor elements, such as transistors and connection wires thereof forming an input/output (I/O) circuit, are formed in the lower layer region of the multilayer pad, breakdown of such semiconductor elements and wires by mechanical stress can also be prevented.

Therefore, damage to the lower layer region of the multilayer pad resulting from an external mechanical stress can be prevented and reliability of the semiconductor device can be improved.

It is preferable that the pad layer 32b and the pad layer 32c are constituted to provide the overlap area between these layers when these are perspectively viewed to the perpendicular upper direction. In this case, the via 36 can be formed to connect the pad layer 32b and the pad layer 32c in the interlayer insulating film 35 also in the overlapping area of the copper wiring regions in addition to the region of external wiring of each pad layer and therefore the pad layers can be connected with many vias. Accordingly, an electric resistance value of the multilayer pad can be reduced, amount of current to be supplied via the multilayer pad can be increased, and reliability for connection failure of vias generated in the manufacturing processes of the semiconductor device can also be improved.

Moreover, it is preferred that the wiring widths of the lattice type copper wiring regions 33 of the pad layers 32b and 32c are set to maximum widths which satisfy the restrictions for the maximum width of the copper wiring and the maximum occupation rate of the copper wiring per unit area. In this case, the occupation area of the copper wiring in each pad layer can be maximized while the above-mentioned restrictions related to the copper wiring are satisfied. Accordingly, a value of the electrical resistance of the multilayer pad can be reduced. Therefore, when the multilayer pad is used as an input/output pad for transmission and reception of the data signal and control signal or the like, the delay of the signal can be lowered. Moreover when the multilayer pad is used as an input/output pad for supply of power source potential, the drop of the power source potential in the multilayer pad can also be lowered.

Moreover, an example of the multilayer pad including the copper pad layer of two layers is illustrated in FIG. 3. However, the number of copper pad layers forming the multilayer pad is never limited and three or more layers, for example, may be used for the multilayer pad. In the case of forming the copper pad layer of three or more layers, the wiring layout of the copper pad layer except for the uppermost layer (aluminum wiring layer) is constituted so that at least one copper pad layer becomes the complementary wiring layout for the wiring layout of the other copper pad layer like the pad layers 32b, 32c of FIG. 3.

Moreover, when the copper pad layer of three or more layers is provided, it is preferable that the wiring layout of the pad layer having the copper wiring is formed so that the adjacent pad layers become the complementary wiring layout with each other. In this case, the effect for preventing transfer of crack and for preventing damage to the lower layer region of the multilayer pad becomes more distinctive.

Moreover, the multilayer pad structure including the pad layer having the copper wiring of FIG. 3 can be formed through the known damascene process. As the method of manufacturing the multilayer pad structure of the present invention, it is enough to use, for example, the manufacturing method disclosed in Japanese Laid-Open Patent Application No. 2003-086589.

Next, an example of structure of the semiconductor device including the pad region and internal circuit region will be described.

Figure 5:
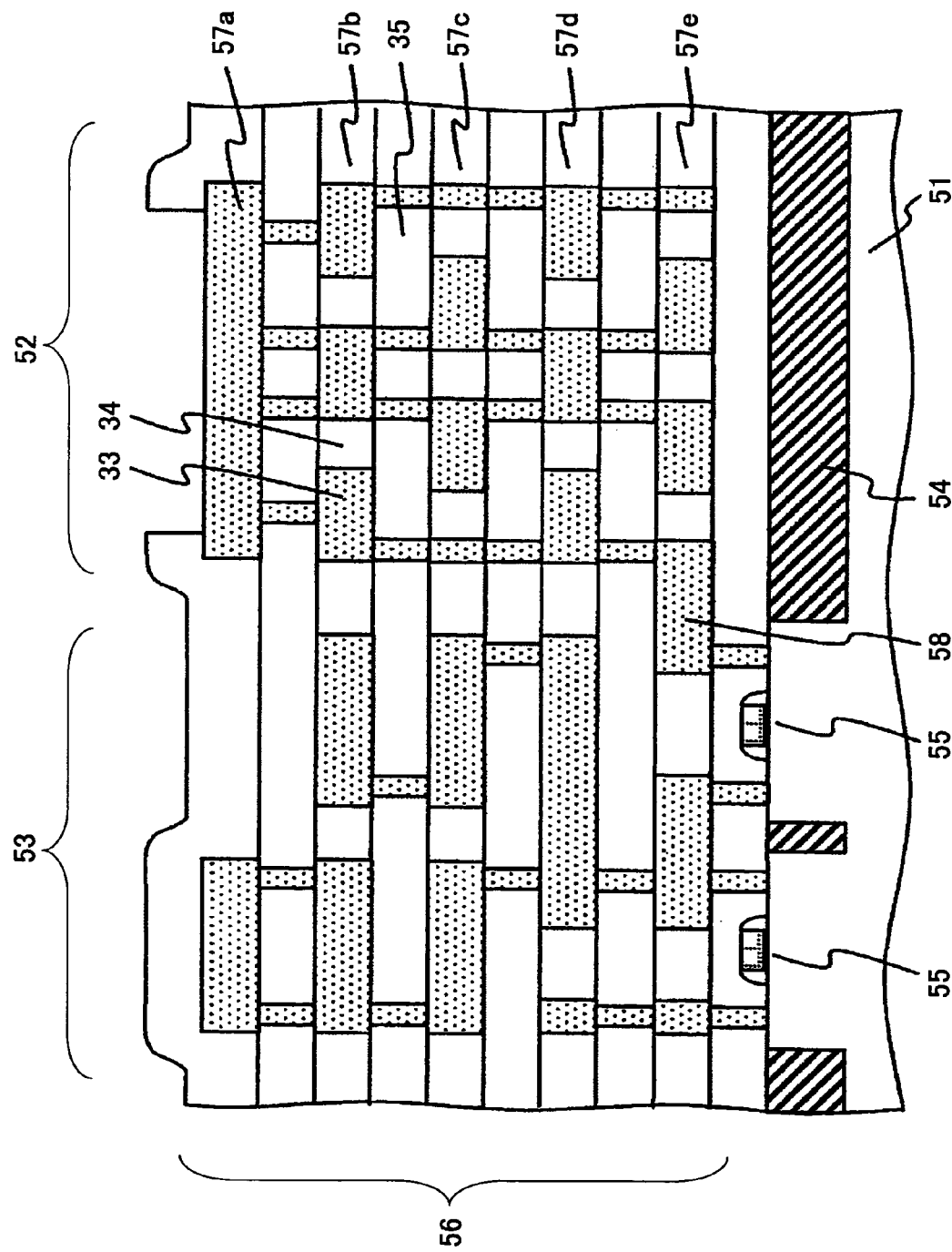
FIG. 5 is a cross-sectional view of a semiconductor device comprising a multilayer pad region including the pad layer having the copper wiring and an internal circuit region in a second embodiment of the invention.

FIG. 5 is a cross-sectional view of a semiconductor device comprising a multilayer pad region including a pad layer having the copper wiring and an internal circuit region in the second embodiment of the invention.

In FIG. 5, the elements like those of FIG. 3 are denoted with the same reference numerals. Reference numeral 51 denotes a semiconductor substrate, 52 denotes a multilayer pad region, 53 denotes an internal circuit region, 54 denotes an element isolating/insulating region, 55 denotes a transistor forming the internal circuit, 56 denotes a multilayer wiring forming the internal circuit, 57 denotes a pad layer forming the multilayer pad, and 58 denotes a lead wire of the multilayer pad.

The internal circuit region 53 is connected to the multilayer pad region 52 via the lead wire 58 to receive supply of the predetermined electrical signals (data signal, control signal, power source potential or the like) from an external system via the multilayer pad. The internal circuit region 53 includes an input/output (I/O) circuit, a storage circuit, and an arithmetic circuit or the like.

The multilayer pad region 52 of FIG. 5 is formed, like the multilayer pad structure of FIG. 3, of a pad layer 57a formed of the aluminum wiring and a plurality of pad layers 57b to 57e including the copper wiring. The plurality of pad layers 57b to 57e are formed to have the wiring layout in which the adjacent pad layers becomes the complementary pad layers with each other. For example, the pad layers 57b and 57d are formed to have the wiring layout similar to that of the pad layer 32b of FIG. 3 (b), and the pad layers 57c and 57e are formed to have the wiring layer similar to that of the pad layer 32c of FIG. 3 (c).

In the semiconductor device of FIG. 5, when the multilayer pad region 52 is perspectively viewed from the perpendicular upper direction for the semiconductor substrate 51, all the regions are covered with the copper wiring in the region of the layer lower than the uppermost layer 57a. In other words, when the multilayer pad region 52 is perspectively viewed from the perpendicular upper direction, the entire part of the multilayer pad region 52 is surely covered with the copper wiring in addition to the aluminum wiring of the uppermost layer 57a.

Accordingly, even when a mechanical stress is applied from the external side in the processes, such as the probing (touch of stylus) in the test process and the wire bonding in the assembling process, reliability of the semiconductor device can be assured as in the case of the multilayer pad structure of FIG. 3.

Figure 6:
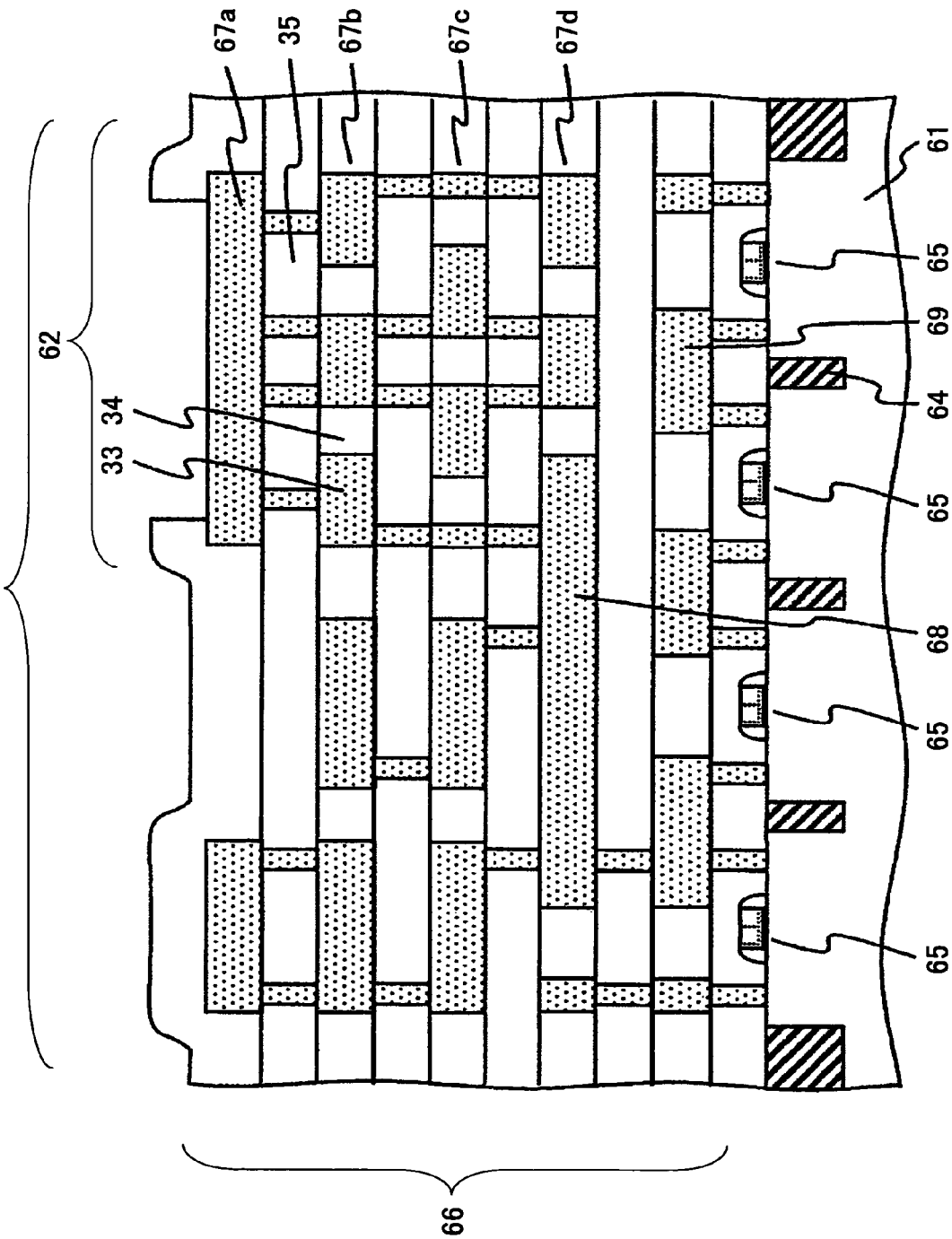
FIG. 6 is a cross-sectional view of the semiconductor device comprising a multilayer pad region including the pad layer having the copper wiring and an internal circuit region in a third embodiment of the invention.

FIG. 6 is a cross-sectional view of the semiconductor device comprising a multilayer pad region including a pad layer having the copper wiring and an internal circuit region in the third embodiment of the invention.

In FIG. 6, the elements like those illustrated in FIG. 3 and FIG. 5 are denoted by the same reference numerals. Reference numeral 61 denotes a semiconductor substrate, 62 denotes a multilayer pad region, 63 denotes an internal circuit region, 64 denotes an element isolating/insulating region, 65 denotes a transistor forming the internal circuit, 66 denotes a multilayer wiring forming the internal circuit, 67 denotes a pad layer forming the multilayer pad, 68 denotes a lead wire from the multilayer pad; and 69 denotes a connecting wire of the transistor 65.

The internal circuit region 63 is connected to the multilayer pad region 62 via the lead wire 68 and receives supply of the predetermined electrical signals (data signal, control signal, power source potential or the like) from an external system via the multilayer pad. The internal circuit region 63 includes an input/output (I/O) circuit, a storage circuit, and an arithmetic operation circuit or the like.

Unlike the semiconductor device of FIG. 5, in the semiconductor device of FIG. 6, the multilayer pad region 62 including the pad layer having the copper wiring and the internal circuit region 63 are formed to be overlapped with each other when viewed from the perpendicular upper direction. Namely, the transistors forming the internal circuit and a part of the connection wiring of these transistors are formed in the lower layer region of the multilayer pad. For example, the transistors 65 forming the input/output (I/O) circuit and the connection wirings 69 for these transistors are formed in the lower layer region of the multilayer pad. With the use of the structure where the multilayer pad is formed on the input/output circuit, the layout area of the semiconductor device can be reduced.

The multilayer pad region 62 of FIG. 6 is constituted, like the multilayer pad structure of FIG. 3, with the pad layer 67a formed of the aluminum wiring and a plurality of pad layers 67b to 67d including the copper wiring. The plurality of pad layers 67b to 67e are formed in the manner that the adjacent pad layers have the complementary wiring layout with each other. For example, the pad layers 67b and 67e are formed to have the wiring layout like the pad layer 32b of FIG. 3 (b), and the pad layer 67c is formed to have the wiring layout like the pad layer 32c of FIG. 3 (c).

Even in the semiconductor device of FIG. 6, when the multilayer pad region 62 is perspectively viewed from the perpendicular upper direction for the semiconductor substrate 61, all the regions are covered with the copper wiring in the region in the lower layer than the uppermost layer 67a. In other words, when viewed perspectively from the perpendicular upper direction, the entire part of the multilayer pad region 62 is surely covered with the copper wiring in addition to the aluminum wiring of the uppermost layer 67a.

Accordingly, even when an external mechanical stress is applied to the pad in the processes such as probing (touch of stylus) in the test process and wiring bonding in the assembling process, reliability of the semiconductor device can be guaranteed as in the case of FIG. 3 and FIG. 5. Particularly, this embodiment can provide the peculiar effect that breakdown of the transistors of the input/output (I/O) circuit formed in the lower layer region of the multilayer pad and connection wirings of these transistors with the mechanical stress can be prevented.

The semiconductor device comprising the multilayer pad region including the pad layer having the copper wiring and the internal wiring region of FIG. 5 or FIG. 6 can be formed through the known damascene process. As the method of manufacturing the semiconductor device of the invention, for example, the manufacturing method disclosed in Japanese Laid-Open Patent Application No. 2003-086589 can be used.

Next, another example of structure of the multilayer pad structure of FIG. 3 will be described.

Figure 7:
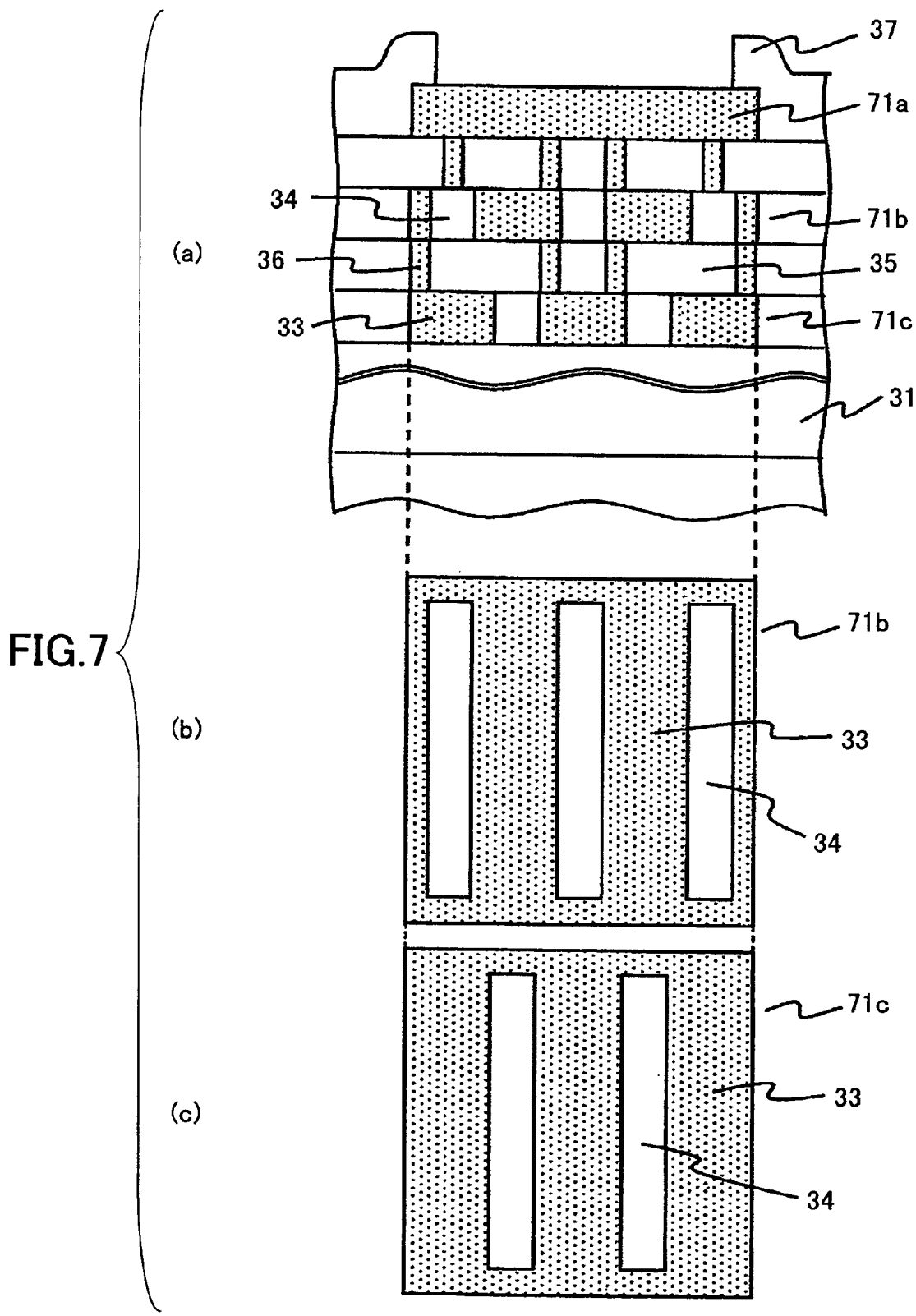
FIG. 7 is a schematic diagram of a multilayer pad structure including a pad layer having the copper wiring in a fourth embodiment of the invention.

FIG. 7 illustrates a multilayer pad structure including a pad layer having the copper wiring in the fourth embodiment of the invention. In FIG. 7, (a) is a cross-sectional view of a copper pad layer (single layer), and (b) and (c) are plan views of the copper pad layer (single layer). The elements like those of FIG. 3 are denoted with the same reference numerals. Reference numeral 71 denotes a pad layer.

The multilayer pad structure of FIG. 7 is different in the wiring layout of the pad layers 71b and 71c having the copper wiring from that of the multilayer pad structure of FIG. 3. The other structure is the same and a description thereof will be omitted.

In FIG. 7, (b) illustrates the wiring layout of the pad layer 71b, and (c) illustrates the wiring layout of the pad layer 71c. As illustrated in FIG. 7, the pad layers 71b and 71c have the lattice type copper wiring structure provided therein with a plurality of rectangular intralayer insulating regions. Meanwhile, the pad layer 71b has the wiring layout which is similar to that of the pad layer 32c of FIG. 3 (c) and the pad layer 71c has the wiring layout which is similar to that of the pad layer 32b of FIG. 3 (b). Namely, the pad layers 71b and 71c have the structure that the laminating sequence of the pad layer is exchanged for the pad layers 32b and 32c of FIG. 3.

Even in the multilayer pad structure of FIG. 7, the pad layers 71b and 71c have the complementary wiring layout with each other, and all the regions are covered with the copper wiring in the lower layer region than the uppermost layer 71a when the pad region is viewed from the perpendicular upper direction for the semiconductor substrate 31 as in the case of the multilayer pad structure of FIG. 3.

Accordingly, even if an external mechanical stress is applied to the pad, reliability of the semiconductor device can be ensured as in the case of FIG. 3.

Figure 8:
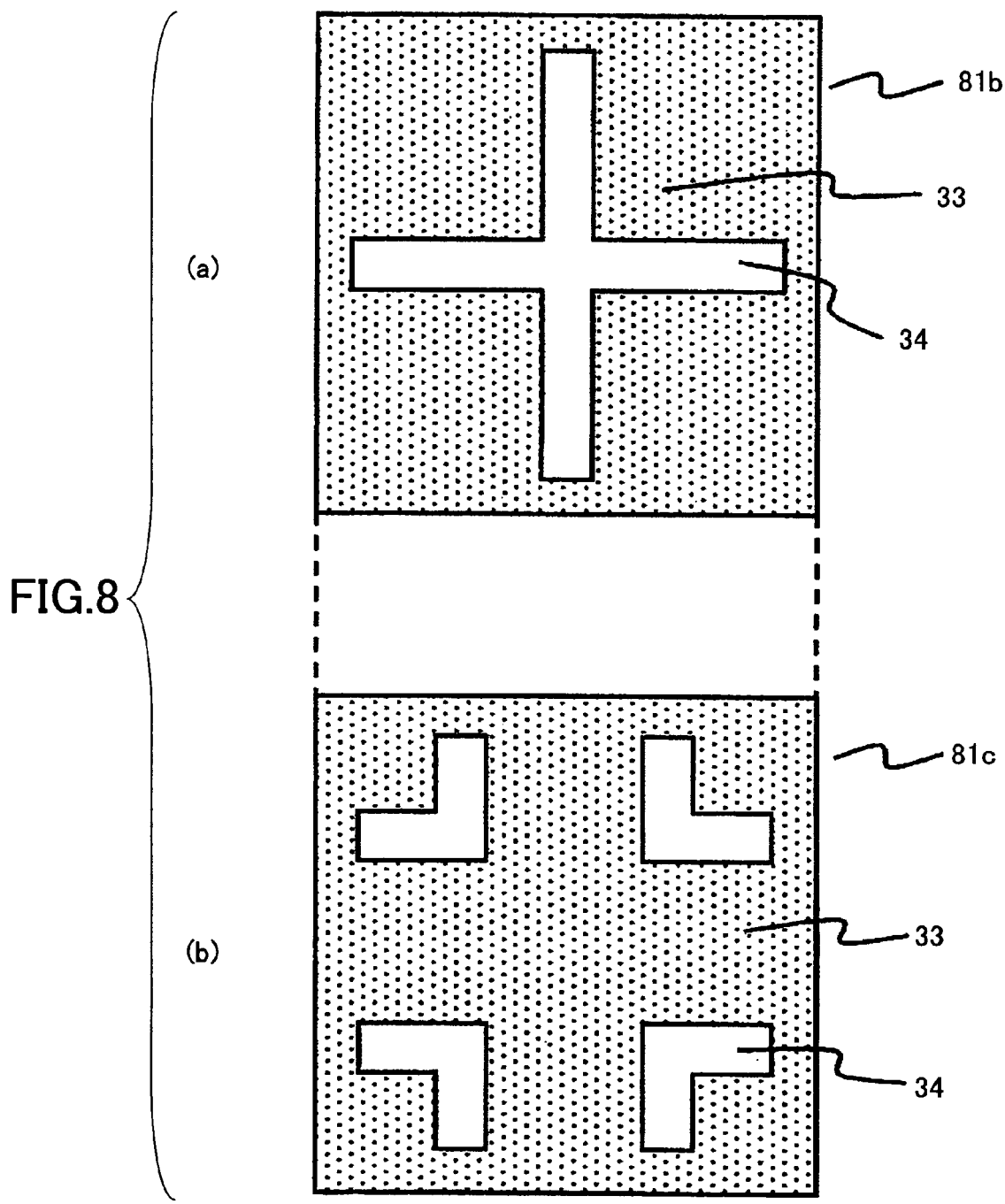
FIG. 8 is a schematic diagram of a multilayer pad structure including a pad layer having the copper wiring in a fifth embodiment of the invention.

FIG. 8 illustrates a multilayer pad structure including a pad layer having the copper wiring in the fifth embodiment of the invention. In FIG. 8, (a) and 8(b) are plan views of the copper pad layer (single layer). Only the plan view of the copper pad layer is illustrated and a cross-sectional view of the multilayer pad structure is not illustrated. In FIG. 8, the elements like those of FIG. 3 are denoted with the same reference numerals. Reference numeral 81 denotes a pad layer.

The multilayer pad structure of FIG. 8 is different in the wiring layout of the pad layers 81b and 81c including the copper wiring from that illustrated in FIG. 3. The other structure is the same, and a description thereof will be omitted.

In FIG. 8, (a) illustrates a wiring layout of the pad layer 81b, and (b) illustrates a wiring layout of the pad layer 81c. As illustrated in FIG. 8, the pad layers 81b and 81c have the copper wiring structure provided therein with the intralayer insulating regions but the shape of the intralayer insulating regions of each pad layer is different from that of the pad layers 32b and 32c of FIG. 3.

Namely, the pad layer 81b has the copper wiring structure in which the plus (+) shape intralayer insulating region 34 is provided at the center thereof. The pad layer 81c has the copper wiring structure in which the L-shape intralayer insulating regions 34 are respectively provided at the areas near the four corners of the rectangular shape. The copper wiring region 33 is formed in the region of the pad layer 81c located just under the plus (+) shape intralayer insulating region 34 at least within the pad layer 81b and the copper wiring region 33 is formed in the region of the pad layer 81b just above the L-shape intralayer insulating region 34 at least within the pad layer 81c.

The pad layers 81b and 81c have the complementary wiring layout with each other even in the multilayer pad structure of FIG. 8, and all the regions are covered with the copper wiring in the region lower than the uppermost pad layers as in the case of the multilayer pad structure of FIG. 3, when the pad region is perspectively viewed from the perpendicular upper direction for the semiconductor substrate.

Accordingly, if an external mechanical stress is applied to the pad, reliability of the semiconductor device can be ensured as in the case of FIG. 3.

Figure 9:
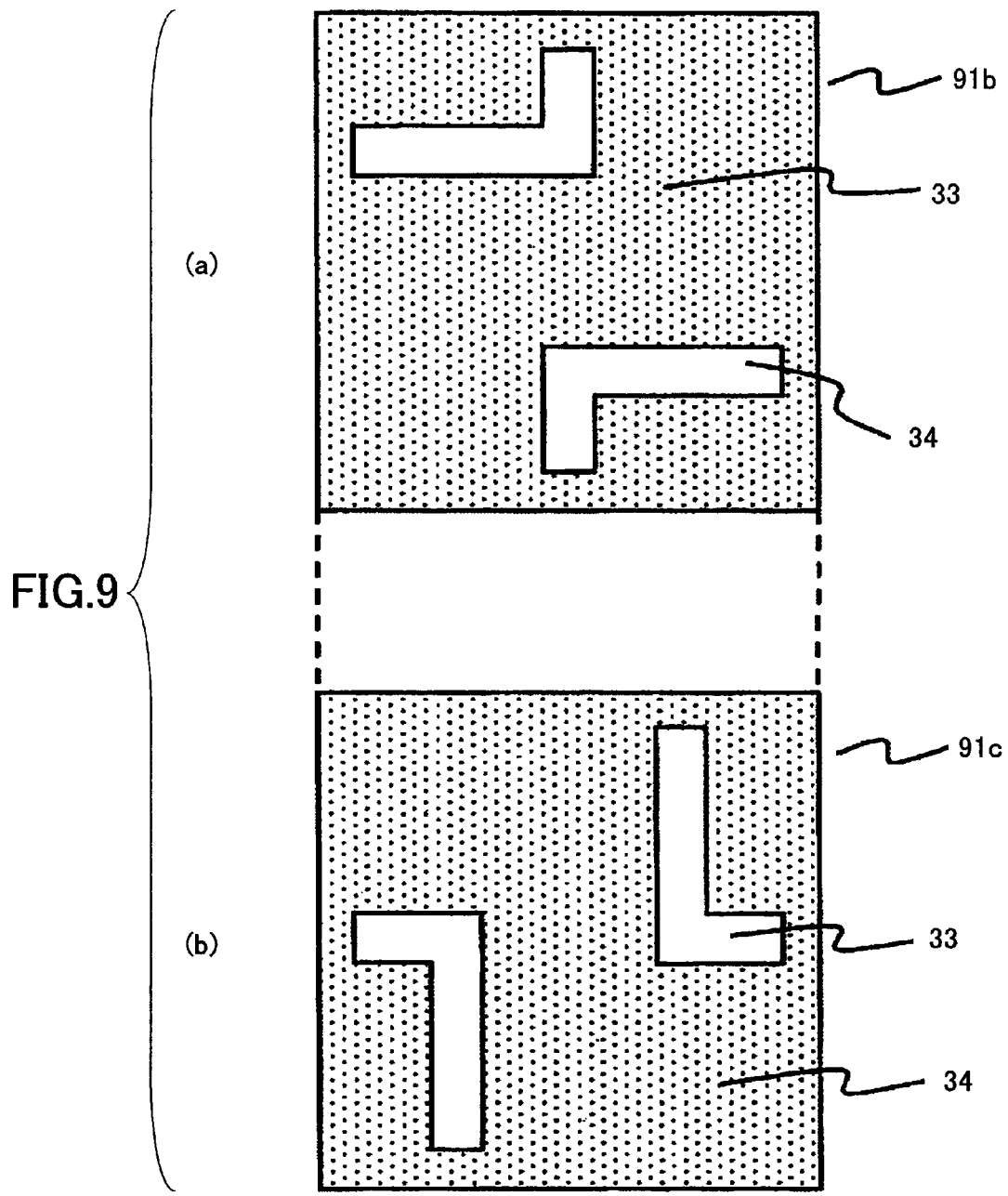
FIG. 9 is a schematic diagram of a multilayer pad structure including a pad layer having the copper wiring in a sixth embodiment of the invention.

FIG. 9 shows a multilayer pad structure including a pad layer having the copper wiring in the sixth embodiment of the invention. In FIG. 9, (a) and (b) are plan views of the copper pad layer (single layer). Only the plan view of the copper pad layer is illustrated and a cross-sectional view of the multilayer pad structure is not illustrated. The elements like those of FIG. 3 are denoted with the same reference numerals. Reference numeral 91 denotes a pad layer.

The multilayer pad structure of FIG. 9 is different in the wiring layout of the pad layers 91b and 91c having the copper wiring from the multilayer pad structure of FIG. 3. The other structure is the same, and a description thereof will be omitted.

In FIG. 9, (a) illustrates a wiring layout of the pad layer 91b, and (b) illustrates a wiring layout of the pad layer 91c. As illustrated in FIG. 9, the pad layers 91b, 91c have therein a copper wiring structure provided with the intralayer insulating region but the shape of the intralayer insulating region of each pad layer is different from the pad layers 32b and 32c of FIG. 3.

Namely, the pad layers 91b and 91c respectively have the copper wiring structure in which the L-shape intralayer insulating regions 34 are provided at the areas near the two corners provided opposed with each other in the external side of the rectangular shape. The copper wiring region 33 is formed in the region of the pad layer 91c located just under the L-shape intralayer insulating regions 34 within at least the pad layer 91b, and the copper wiring region 33 is formed in the region of the pad layer 91b located just above the L-shape intralayer insulating regions 34 at least within the pad layer 91c.

Even in the multilayer pad structure of FIG. 9, the pad layers 91b and 91c respectively have the complementary wiring layout with each other. Therefore, when the pad region is perspectively viewed from the perpendicular upper direction for the semiconductor substrate as in the case of the multilayer pad structure of FIG. 3, all the regions are covered with the copper wiring layer in the region lower than the uppermost pad layer.

Accordingly, even if an external mechanical stress is applied to the pad, reliability of the semiconductor device can be ensured as in the case of the semiconductor device of FIG. 3.

Figure 10:
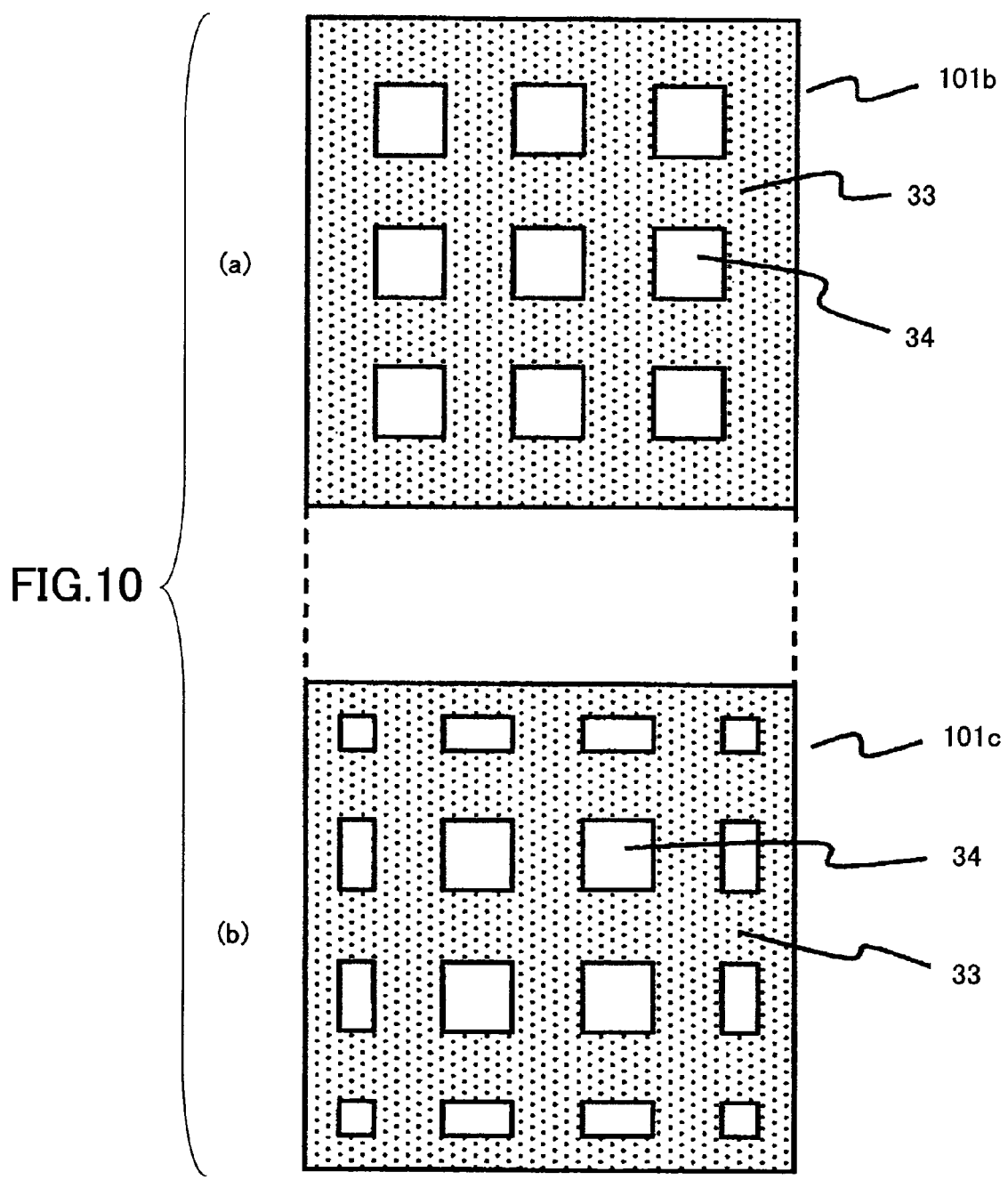
FIG. 10 is a schematic diagram of a multilayer pad structure including a pad layer having the copper wiring in a seventh embodiment of the invention.

FIG. 10 illustrates a multilayer pad structure including a pad layer having the copper wiring in the seventh embodiment of the invention. In FIG. 10, (a) and (b) are plan views of a copper pad layer (single layer). Only the plan view of the copper pad layer is illustrated and a cross-sectional view of the multilayer pad structure is not illustrated. In FIG. 10, the elements like those of FIG. 3 are denoted with the same reference numerals. Reference numeral 101 denotes a pad layer.

The multilayer pad structure of FIG. 10 is different in the wiring layout of the pad layers 101b and 101c having the copper wiring from the multilayer pad structure of FIG. 3. The other structure is the same, and a description thereof will be omitted.

In FIG. 10, (a) illustrates a wiring layout of the pad layer 101b, and (b) illustrates a wiring layout of the pad layer 101c. As illustrated in FIG. 10, the pad layers 101b and 101c respectively have the copper wiring structure provided therein with the intralayer insulating regions. However, the shape of the intralayer insulating regions of each pad layer is different from that of the pad layers 32b and 32c of FIG. 3.

Namely, the pad layers 101b and 101c respectively have a mesh type copper wiring structure having the regular layout of the constant pitch in the vertical and horizontal directions in this figure and providing therein a plurality of rectangular intralayer insulating regions 34. However, in the layout of the intralayer insulating regions in the pad layer 101b, the intralayer insulating regions are respectively deviated by a half-pitch in the vertical and horizontal direction in the figure for the intralayer insulating regions in the pad layer 101c. Therefore, the copper wiring region 33 is formed in the region of the pad layer 101c located just under the rectangular intralayer insulating regions 34 at least within the pad layer 101b, and the copper wiring region 33 is formed in the region of the pad layer 101b located just above the rectangular intralayer insulating regions 34 at least within the pad layer 101c.

Accordingly, even in the multilayer pad structure of FIG. 10, the pad layers 101b, 101c have the complementary wiring layout with each other, and all the regions are covered with the copper wiring in the region lower than the uppermost pad layer, like the multilayer pad structure of FIG. 3, when the pad region is perspectively viewed from the perpendicular upper direction for the semiconductor substrate. In other words, when the pad region is perspectively viewed from the perpendicular upper direction, the entire part of the pad region is surely covered with the copper wiring in addition to the aluminum wiring of the uppermost layer.

Accordingly, even when an external mechanical stress is applied to the pad, reliability of the semiconductor device can be ensured as in the case of FIG. 3.

The shape and layouts of the intralayer insulating regions in the pad layer having the copper wiring in the multilayer pad structure are not limited to the shape and layouts of the above-described embodiments, and various changes or modifications may be made. It is adequate that at least two pad layers forming the multilayer pad structure are formed to have the complementary wiring layouts with each other. In other words, the copper wiring region is formed in the lower pad layer located just under the intralayer insulating regions in the pad layer of the upper side. In the same manner, the copper wiring layer is formed in the region of the upper pad layer located just above the intralayer insulating regions in the pad layer of lower side.

What is claimed is:

1. A semiconductor device including a multilayer pad, the multilayer pad comprising:
a first pad layer provided over a semiconductor substrate to have a first copper wiring region of copper and a first intralayer insulating region of an insulating material provided within the first copper wiring region,
a second pad layer provided over the first pad layer via a first interlayer insulating film to have a second copper wiring region of copper and a second intralayer insulating region of the insulating material provided within the second copper wiring region;
the first interlayer insulating film provided between the first pad layer and the second pad layer;
an uppermost pad layer provided over the second pad layer via a second interlayer insulating film to have an exposed surface, and
the second interlayer insulating film provided between the second pad layer and the uppermost pad layer;
wherein a width of each of the first pad layer and the second pad layer, located under the uppermost pad layer, is equal to or larger than a width of the exposed surface of the uppermost pad layer,
wherein the first copper wiring region, the first intralayer insulating region, the second copper wiring region, and the second intralayer insulating region are provided in the first and second pad layers, and when the multilayer pad is perspectively viewed from a perpendicularly upper direction to the semiconductor substrate, the first intralayer insulating region is entirely overlaid with the second copper wiring region and the second intralayer insulating region is entirely overlaid with the first copper wiring region,
wherein the first copper wiring region of the first pad layer surrounds an entire peripheral area of the first intralayer insulating region and the second copper wiring region of the second pad layer surrounds an entire peripheral area of the second intralayer insulating region.

2. The semiconductor device according to claim 1 wherein a layout of the first copper wiring region and the first intralayer insulating region in the first pad layer and a layout of the second copper wiring region and the second intralayer insulating region in the second pad layer are complementary with each other.

3. The semiconductor device according to claim 2 wherein the multilayer pad comprises pad layers having three or more copper wiring layers including the first and second pad layers, and the first pad layer and the second pad layer are adjacent with each other.

4. The semiconductor device according to claim 1 wherein the first copper wiring region is formed at least in a region of the first pad layer located just under the second intralayer insulating region of the second pad layer, and the second copper wiring region is formed at least in a region of the second pad layer located just above the first intralayer insulating region of the first pad layer.

5. The semiconductor device according to claim 1 wherein the first copper wiring region of the first pad layer and the second copper wiring region of the second pad layer are formed to have a mutually overlapping region when the multilayer pad is perspectively viewed from the perpendicularly upper direction, and a via for connecting the first pad layer and second pad layer is provided in the interlayer insulating film for the mutually overlapping region of the first and second copper wiring regions.

6. The semiconductor device according to claim 1 wherein each of the first and second pad layers is formed through a damascene process.

7. The semiconductor device according to claim 1, wherein a part of an internal circuit of the semiconductor device is formed in a low region which is provided lower than the first pad layer.

8. The semiconductor device according to claim 7, wherein the internal circuit is an input/output circuit for transmitting and receiving electrical signals to and from an external circuit, and transistors and a part of connecting wiring of the transistors forming the input/output circuit are formed in the lower region provided lower than the first pad layer.

9. The semiconductor device according to claim 1, wherein the first copper wiring region of the first pad layer and the second copper wiring region of the second pad layer form a lattice type or mesh type copper wiring structure.

10. A semiconductor device in a multilayer pad, the multilayer pad comprising:
  a first pad layer provided over a semiconductor substrate to have a first copper wiring region and a first intralayer insulating region of an insulating material provided within the first copper wiring region;
  a second pad layer provided over the first pad layer via a first interlayer insulating film to have a second copper wiring region of copper and a second intralayer insulating region of the insulating material provided within the second copper wiring region;
  the first interlayer insulating film provided between the first pad layer and the second pad layer;
  an uppermost pad layer provided over the second pad layer via a second interlayer insulating film to have an exposed surface;
  the second interlayer insulating film provided between the second pad layer and THE uppermost pad layer; and
  an aperture formed in a cover layer on the multilayer pad,
  wherein a width of each of the first pad layer and the second pad layer, located under the uppermost pad layer, is equal to or larger than a width of the exposed surface of the uppermost pad layer,
  wherein the first copper wiring region, the first intralayer insulating region, the second copper wiring region, and the second intralayer insulating region are provided in the first and second pad layers, and when the multilayer pad is perspectively viewed from a perpendicularly upper direction to the semiconductor substrate, the first intralayer insulating region is entirely overlaid with the second copper wiring region and the second intralayer insulating region is entirely overlaid with the first copper wiring region,
  wherein the first copper wiring region of the first pad layer surrounds an entire peripheral area of the first intralayer insulating region and the second copper wiring region of the second pad layer surrounds an entire peripheral area of the second intralayer insulating region.

11. The semiconductor device according to claim 1, wherein said first copper wiring region completely surrounds said first intralayer insulating region within the first copper wiring region.

* * * * *